United States Patent [19]

Harris et al.

[11] 4,093,503
[45] June 6, 1978

[54] METHOD FOR FABRICATING ULTRA-NARROW METALLIC LINES

[75] Inventors: Erik Preston Harris, Yorktown Heights; Robert William Keyes, Ossining, both of N.Y.

[73] Assignee: International Business Machines Corporation, Armonk, N.Y.

[21] Appl. No.: 775,335

[22] Filed: Mar. 7, 1977

[51] Int. Cl.² .................................................. C23F 1/02
[52] U.S. Cl. ..................... 156/628; 148/187; 156/643; 156/656; 156/659; 427/63
[58] Field of Search .............. 156/628, 643, 656, 659, 156/664; 148/1.5, 187; 427/63, 38

[56] References Cited

U.S. PATENT DOCUMENTS 3,738,880  6/1973  Laker ................................... 156/628
3,801,366  4/1974  Lemelson ............................. 427/43

OTHER PUBLICATIONS

IBM Technical Disclosure Bulletin, vol. 11, No. 11, Apr. 1969, Printed Circuit Production by F. A. Karner et al., p. 1449.

*Primary Examiner*—William A. Powell
*Attorney, Agent, or Firm*—John J. Goodwin

[57] ABSTRACT

A method for fabricating very narrow superconducting metallic lines on a substrate using ion-implantation and etching techniques. The method permits lines to be produced which are much smaller than those fabricated by conventional masking and etching techniques. It makes the fabrication of very small Josephson and other superconducting devices possible. Also since lines are formed in metals, they have high conductivity, so are useful as ordinary conductors at high temperature or when the technique is utilized with non-superconducting materials. The method includes the steps of depositing a selected metal film on a substrate, applying a photoresist or other masking pattern and exposing, etching away the exposed region, ion-implanting the edge of the resulting pattern, removing the photoresist and etching away the unimplanted portion of the metal leaving an ultra-narrow line pattern.

4 Claims, 5 Drawing Figures

U.S. Patent    June 6, 1978    4,093,503
FIG. 1A    FIG. 1B
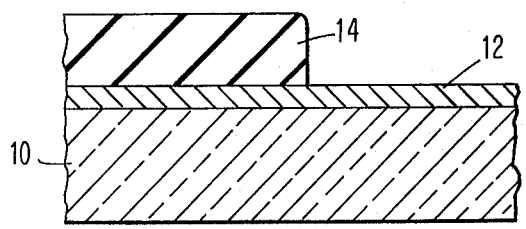
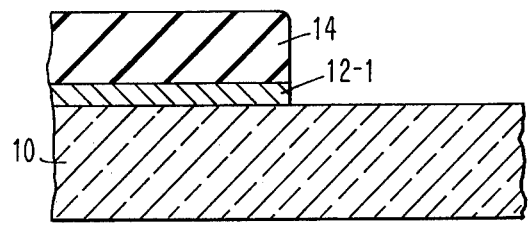
FIG. 1C
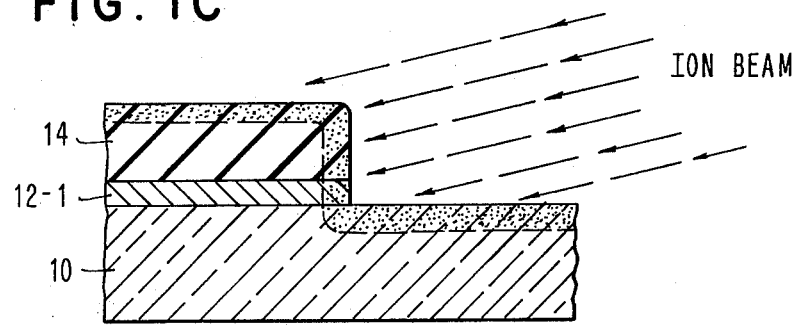
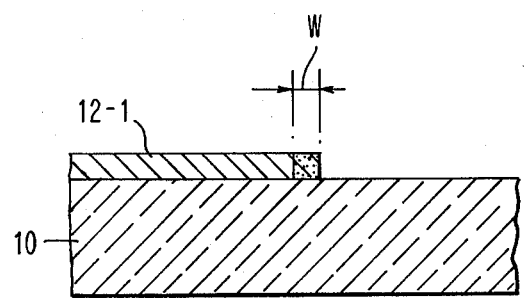
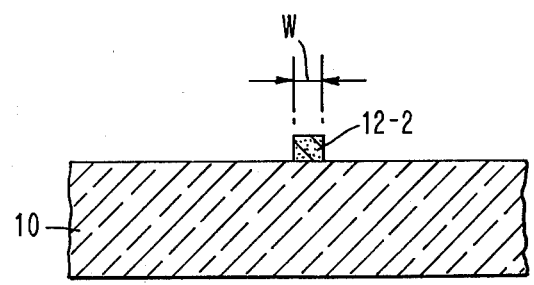
FIG. 1D    FIG. 1E

METHOD FOR FABRICATING ULTRA-NARROW METALLIC LINES

BACKGROUND OF THE INVENTION

1. Field of the Invention

The present invention relates to a method for forming ultranarrow metallic lines on a substrate and more particularly to the formation of ultra-narrow metallic lines using ion-implantation and etching techniques and wherein the resulting lines can have superconductive properties.

2. Description of the Prior Art

Techniques have been described for forming narrow lines, composed of polysilicon, using doping and etching techniques. A publication in the *New Scientist*, Sept. 25, 1975 on page 707 discusses a technique wherein polysilicon rather than metal is masked and doped with boron by diffusion. The masking layer is removed followed by removal of the undoped region of polysilicon by selective etching to leave the fine boron doped line.

The fact that ion implantation of certain impurities enhances the superconductivity of selected transition metals is also known, and is described in chapter 69 of the publication by O. Meyer entitled *Ion Implantation in Superconductors in New Uses of Ion Accelerators*, Ed. by J. F. Ziegler, Plenum Press, New York 1975.

The method of the present invention is distinct from the prior art in that the unobvious step of ion-implanting metal is used, providing both enhanced superconductivity and resistance to etching in a single processing operation so that ultra-narrow lines that also have superconductive properties can be fabricated.

SUMMARY OF THE INVENTION

The present invention provides the concept that implantation of selected metals with nitrogen, phosphorus and sulphur ions produces both enhanced superconductivity and resistance to etching. This combination of properties has been used to devise processes for producing miniature superconducting devices. Even when the possibility of producing superconductivity is not used to advantage, the invention also provides a substantial advance over the prior art in producing ultra-narrow lines in metals, which are highly conducting rather than in polysilicon which is a poor electrical conductor.

Accordingly, an object of the present invention is to provide an improved method for fabricating ultra-narrow metallic lines.

Another object of the present invention is to provide an improved method for fabricating metallic lines using the step of ion-implantation.

A further object of the present invention is to provide an improved method for fabricating superconductive metallic lines for ultra-miniature superconductive devices.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIGS. 1A, 1B, 1C, 1D and 1E are illustrations of separate steps of an embodiment of a method for forming ultra-narrow metallic lines according to the principles of the present invention.

DESCRIPTION OF THE PREFERRED EMBODIMENT

FIGS. 1A, 1B, 1C, 1D and 1E illustrate the steps of an embodiment of a method for obtaining a very desirable result: the fabrication of ultra-narrow metal lines on a substrate by masking and ion implantation techniques. Metal lines are preferable to semiconductor lines such as polysilicon because of their much higher conductivity, and even circuits formed from semiconductor material usually use metal for interconnection lines.

In forming lines for integrated circuit packages, it is very important that the lines be as thin as possible for optimum packing density. In typical methods of forming lines such as photolithography, electron beam lithography and X-ray lithography, the thickness of the masks employed create a practical limit on minimum line thickness. This is because the vertical dimension of the mask aperture through which the beam is directed is much larger than the horizontal dimension of the line being formed on the substrate beneath the mask.

Referring to FIG. 1A a suitable substrate 10 composed, for example of non-metals, such as silicon or sapphire is shown having a metal film 12 disposed thereon. Tungsten may be used for film 12, however metals such as molybdenum and other transition metals whose transition temperature increases due to ion implantation may also be employed. In FIG. 1A a photoresist pattern 14 or other suitable masking layer is also disposed on the metal film 12 and exposed to radiation in a conventional manner. Then, as illustrated in FIG. 1B, the exposed portion of the metal layer 12 is etched away leaving portion 12-1.

In the next step, as shown in FIG. 1C the exposed edge of the metal 12-1, as well as the photoresist 14 and substrate 10 are ion-implanted by directing an ion beam at an angle with respect to substrate 10. The depth of the implant is directly determined by the desired line width W, which can be in the order of 300 Angstroms for a 40 kev $N^+$ ion implant into tungsten. The photoresist layer 14 is then removed by conventional techniques leaving the metal layer 12-1 including the narrow width implanted region W remaining on substrate 10.

The implanted region W of metal layer 12-1 has a greater etch resistance than the unimplanted region of metal layer and therefore selective or preferential etching may be carried out. Thus, in FIG. 1E, the result of the etching step is illustrated wherein the unimplanted metal layer has been etched away leaving an ultra-narrow metal line 12-2 of width W which remains because of its greater etch-resistance.

The ultra-narrow metal line 12-2 illustrated in FIG. 1E is also suitable for superconductive applications because ion implantation into certain metals greatly enhances superconductivity, for example, $N^+$ or $S^+$ implantation into tungsten can raise the transition temperature from 0.02° K to approximately 5° K depending on the dose. Some superconductive applications for the ultra-narrow lines fabricated by the disclosed method include very low capacitance Josephson tunnel junctions for detection and mixing at submillimeter wavelengths. Such junctions may be made by depositing one ultra-narrow line across another, with a tunnel barrier in between. Also, loops, probes and flux transformers for superconducting magnetometers can be fabricated by the present method. Probes, in particular, can be made very small, permitting extremely fine-scaled variations in the magnetic field to be mapped. For example, for a 3000 Angstrom line produuced in photoresist with a 500 Angstrom implantation on each side of the line would leave a region only enclosed by the superconducting loop.

In summary what has been described is a unique method for fabricating ultra-narrow metal lines, particularly metal lines which are superconductive. The method basically includes the steps of delineating a pattern on a thin metal film on a substrate by masking techniques, ion implanting the edge of the metal film to a desired depth, removing the mask portion from the metal film and etching away the unimplanted portion of the metal film to leave a ultra-narrow metal line having a width equal to the implanted depth.

One skilled in the art will appreciate that a number of suitable metals and suitable ions can be employed in the method depending on the end use of the fabricated lines.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for fabricating ultra-narrow metal lines on a supporting substrate comprising the steps of:

applying a thin metal film on the surface of a substrate, covering selected portions of said thin metal film with masking material to delineate a desired pattern, removing the unmasked portions of said thin metal film, selectively ion implanting the edges of said remaining masked portions of said thin metal film to predetermined desired depth, removing said masking material from said remaining portions of said thin metal film, and removing by selective etching the unimplanted portions of said thin metal film to provide a pattern of ultra-narrow metal lines on said substrate.

2. A method according to claim 1 wherein said metal film is a transition metal characterized by having a transition temperature property which increases when the metal is ion implanted such that the ultra-narrow metal lines have superconductive properties.

3. A method according to claim 2 wherein said metal film is tungsten.

4. A method according to claim 1 wherein said depth of said ion implantation is approximately 500 Angstroms and said resulting ultra-narrow metal lines are approximately 500 Angstroms wide.

* * * * *